US012733447B2

(12) United States Patent
Hoffrogge et al.

(10) Patent No.: US 12,733,447 B2
(45) Date of Patent: Sep. 8, 2026

(54) WAFER CHUCK HAVING MULTIPLE SIMULTANEOUSLY ACTUATED WAFER CONTACT FINGERS FOR HANDLING A WAFER

(71) Applicant: PVA TePla Analytical Systems GmbH, Westhausen (DE)

(72) Inventors: Peter Hoffrogge, Oberkochen (DE); Mario Lowack, Neuburg an der Kammel (DE)

(73) Assignee: PVA TePla Analytical Systems GmbH, Westhausen (DE)

( * ) Notice: Subject to any disclaimer, the term of this patent is extended or adjusted under 35 U.S.C. 154(b) by 1185 days.

(21) Appl. No.: 17/719,164

(22) Filed: Apr. 12, 2022

(65) Prior Publication Data

US 2022/0328341 A1 Oct. 13, 2022

(30) Foreign Application Priority Data

Apr. 13, 2021 (DE) ..................... 10 2021 109 210.8

(51) Int. Cl.
*B25J 15/10* (2006.01)
*G01N 29/06* (2006.01)
*H10P 72/76* (2026.01)

(52) U.S. Cl.
CPC .......... *H10P 72/7602* (2026.01); *B25J 15/10* (2013.01); *G01N 29/0681* (2013.01); *G01N 2291/2697* (2013.01)

(58) Field of Classification Search
CPC .......... H01L 21/68707; G01N 29/0681; G01N 2291/2697; B25J 15/10; B25J 15/12
USPC .......................................... 294/106; 414/941
See application file for complete search history.

(56) References Cited

U.S. PATENT DOCUMENTS 4,453,757 A * 6/1984 Soraoka .................. B25J 15/02 294/34
5,192,087 A 3/1993 Kawashima
5,566,466 A * 10/1996 Hearne ............ H01L 21/68728 198/379
5,785,325 A 7/1998 Daetwyler
6,143,147 A 11/2000 Jelinek
6,217,034 B1 4/2001 Smedt et al.
(Continued)

FOREIGN PATENT DOCUMENTS

CN 112053965 A 12/2020
JP H04-142054 A 5/1992
(Continued)

*Primary Examiner* — Paul T Chin
(74) *Attorney, Agent, or Firm* — Scully, Scott, Murphy & Presser, P.C.

(57) ABSTRACT

A wafer chuck for handling a wafer that can be used in a wafer process device or in a scanning acoustic microscope. The wafter chuck having a fixing device for the wafer. Wherein the fixing device has a free space for receiving the wafer and a holder with multiple wafer contact fingers, which are movable relative to the holder for a wafer. The wafer contact fingers are arranged annularly around the free space for the wafer, such as in one plane. The wafer contact fingers can be moved in the direction of the free space for the wafer or can be moved away from the free space for the wafer. One actuation device for the wafer contact fingers is provided and, when the actuation device is actuated, the wafer contact fingers are moved or can be moved simultaneously.

23 Claims, 5 Drawing Sheets

(56) References Cited

U.S. PATENT DOCUMENTS 6,273,484 B1 * 8/2001 Peng ........................ B25B 5/06 414/941
6,435,807 B1 * 8/2002 Todorov ............ H01L 21/68707 414/757
6,752,442 B2 * 6/2004 McNurlin ......... H01L 21/68707 294/90
6,932,558 B2 * 8/2005 Wu ........................ H01L 21/68 414/757
7,408,624 B2 8/2008 Van De Moosdijk
7,538,474 B2 * 5/2009 Wong .................. H01H 1/0036 310/319
8,556,318 B2 * 10/2013 Wu .................. H01L 21/68707 414/941
2002/0153676 A1 * 10/2002 Noguchi ........... H01L 21/67288 118/503
2004/0206304 A1 10/2004 Menear
2005/0193943 A1 9/2005 Shimbara
2006/0027323 A1 2/2006 Miya
2008/0189975 A1 * 8/2008 Miya ................ H01L 21/68728 414/781
2014/0077431 A1 3/2014 Weaver et al.
2016/0348773 A1 * 12/2016 Sebert .................... B23Q 11/10
2016/0379863 A1 * 12/2016 Naor ................. H01L 21/68707 414/800
2019/0148212 A1 5/2019 Lin et al.
2020/0020563 A1 * 1/2020 Nishida ............. H01L 21/67028

FOREIGN PATENT DOCUMENTS

JP H08294807 A 11/1996
JP 2000-306982 A 11/2000
JP 2003-282681 A 10/2003
JP 2006049598 A 2/2006
JP 2007013165 A 1/2007
JP 2021022653 A 2/2021
TW 424293 B 3/2001
TW 201508860 A 3/2015
WO 2000041217 A2 7/2000
WO 2020/072712 4/2020

* cited by examiner 1
10
12
14
16
18
20
22
24

1
132
140
116
119
116
116
130
132
100
134
126
119
135
113
50

WAFER CHUCK HAVING MULTIPLE SIMULTANEOUSLY ACTUATED WAFER CONTACT FINGERS FOR HANDLING A WAFER

RELATED APPLICATIONS

This application claims priority to German patent application DE 10 2021 109 210.8, which was filed on Apr. 13, 2021 and is herein incorporated by reference in its entirety.

BACKGROUND OF THE INVENTION

It is known that what are known as wafer chucks are used to hold plate-like objects, such as wafers made of silicon or the like, for use, for example, in a scanning acoustic microscope, by means of which the wafer is correspondingly positioned and fixed. The wafer lies on a suitable holder for this, which can be adjusted in relation to a scanning plane. In doing this, it is a requirement that the wafer is touched on its substrate side. If the substrate wafer cannot be touched over its entire surface, what are known as vacuum suction devices, among other things, are employed which touch and hold the wafer only on the outer edge, but still on the wafer surface.

The depth of field of the ultrasonic probes used for the examination of wafers in scanning acoustic microscopy is typically in the range of approximately 100 μm. It is therefore necessary that the wafer is aligned with the scanning plane within the depth of field of the probe. In addition, vibrations and other types of mechanical offset on the magnitude of the pixel size should be avoided during ultrasonic imaging in order in this way to avoid artifacts in the examinations by means of a scanning acoustic microscope. For this, the wafer must be held stably and without vibrations during the entire examination. The requirements for the lateral stability only allow deviations of less than 10 μm; in the direction of the sound wave propagation, a tilt of less than 100 μm is to be sought. To prevent scanning artifacts, it is required that the vibrations remain below an amplitude of 10 μm amplitude.

In the prior art, soft suction devices are also employed to fix wafers, which fix the wafer to a stable base. The position of the base can be adjusted here in the Z-direction to align the wafer. During operation, the soft suction devices generate particles on the wafer which can be detected during contamination and particle measurement. For many production processes in semiconductor production, the requirements for the cleanliness of active surfaces are very high. The particles generated on the suction cups, however, leave behind a clear signature, which is referred to as a "tool fingerprint." For many manufacturing processes, these fingerprints or respectively signatures must be avoided.

When checking complex structures, the wafers are also examined in a scanning acoustic microscope with ultrasound in the transmission. Here, the wafers are arranged between a transmitting probe and a receiving probe so that the probes are located, for example, above or respectively below the wafer. The ultrasonic testing of the wafer is disrupted here by the holding suction devices for the wafer and supports. In addition, there are regions of the wafer in this case that cannot be examined.

For ultrasonic imaging of a wafer by means of a scanning acoustic microscope, water as a coupling medium is necessary. During the scanning process of the wafer, the water is set in motion and can induce vibrations and other movements in the wafer. Since the wafer is typically placed only on three points, as a result of its elastic properties it can form low-frequency vibrations due to the induction of simple vibration modes, which vibrations can generate clearly detectable disturbances and artifacts during ultrasonic imaging due to their large amplitude.

BRIEF SUMMARY OF THE INVENTION

The present invention relates to a wafer chuck for handling a wafer, in particular in a wafer process device, further preferably in a scanning acoustic microscope, with a fixing device for the wafer, wherein the fixing device has a free space for receiving the wafer and a holder with multiple wafer contact fingers, which are movable relative to the holder for a wafer. The wafer contact fingers are arranged annularly around the free space for the wafer, preferably in one plane. The wafer contact fingers can be moved in the direction of the free space for the wafer or can be moved away from the free space for the wafer. One actuation device for the wafer contact fingers is provided and, when the actuation device is actuated, the wafer contact fingers may be moved simultaneously.

In the wafer chuck described above, the holder has multiple wafer contact fingers, each having a pivot axis, wherein the wafer contact fingers can each be pivoted about their pivot axes, and wherein the pivot axes of the wafer contact fingers are aligned parallel to each other. The actuation device for the wafer contact fingers is configured such that, when the actuation device is actuated, the wafer contact fingers may be pivoted about their pivot axes simultaneously.

When the actuation device is actuated, the wafer contact fingers may be brought into contact with the edge of a wafer or the contact of the individual wafer contact fingers with the wafer may be released.

The fixing device has as a holder—a holding ring with a disk-shaped receiving hole formed as a free space for receiving a wafer, wherein in particular the holding ring is produced from an electrically conductive material, in particular metal, preferably steel or stainless steel.

The wafer contact fingers may be arranged annularly on the holding ring, wherein in particular the holding ring is configured with recesses for receiving wafer contact fingers.

The actuation device for the wafer contact fingers may have control curves, each for one wafer contact finger, wherein the control curves are each operatively connected to the wafer contact fingers.

The actuation device for the wafer contact fingers may be configured as a control ring, wherein in particular the control ring can be moved relative to a holder, in particular to a holding ring for the wafer contact fingers. The control ring may be produced from an electrically conductive material, in particular metal, and further preferably steel or stainless steel.

The wafer chuck may have at least two different types of wafer contact fingers.

The control ring for the wafer contact fingers may have one control curve for each type of wafer contact fingers, and the control curves for each type of wafer contact fingers may differ from each other.

In the wafer chuck, with a rotational movement of the control ring in a first direction of rotation, the control curves for the wafer contact fingers are configured such that, by means of a control curve of a first type for the wafer contact fingers of a first type, the wafer contact fingers of the first type are pivoted in the direction of a wafer and, simultaneously by means of a control curve of a second type for the wafer contact fingers of a second type, the wafer contact fingers of the second type are pivoted away from the wafer, and that when the control ring is moved in a second direction of rotation which is opposite to the first direction of rotation, the control curves for the wafer contact fingers are configured such that, by means of the control curve of the first type for the wafer contact fingers of the first type, the wafer contact fingers of the first type are pivoted away from the wafer and, by means of the control curve of the second type for the wafer contact fingers of the second type, the wafer contact fingers of the second type are pivoted in the direction of the wafer.

The fixing device may be configured as a holding frame with a polygonal or polygon-like, in particular closed, free space, in particular receiving hole, for receiving a wafer, wherein in particular the holding frame is produced from an electrically conductive material, in particular metal, further preferably steel or stainless steel.

The wafer contact fingers may be arranged adjoining the polygonal or polygon-like free space, in particular the receiving hole of the holding frame.

The actuation device for the wafer contact fingers may have a single, control body, a control cable, and/or a control rod for the wafer contact fingers or multiple control bodies, preferably working together, in particular control cables and/or control rods, for the wafer contact fingers wherein the control body or the control bodies are operatively connected to the wafer contact fingers. The control body or the control bodies for the wafer contact fingers may be produced from an electrically conductive material such as metal and preferably steel or stainless steel.

The control body or the control bodies for the wafer contact fingers may be guided movably along the sides of the polygonal or polygon-like free space, in particular the receiving hole of the holding frame.

A drive for the control body or the control bodies is provided.

When the control body or the control bodies are moved in a direction of movement, preferably along the polygonal or polygon-like free space, in particular the receiving hole of the holding frame, at least one or more first wafer contact fingers are moved in a pivoting direction and simultaneously at least one further wafer contact finger may be moved opposite to the pivoting direction of the first wafer contact finger or fingers.

The wafer chuck may have at least two different types of wafer contact fingers. When the control body or control bodies are moved in a first direction, one or more wafer contact fingers of a first type may be pivoted in the direction of a wafer and simultaneously one or more wafer contact fingers of the second type may be pivoted away from the wafer.

The wafer contact fingers can each have free ends which face the edge of the wafer, wherein the free ends of the wafer contact fingers are configured such that the wafer contact fingers hold a wafer by means of a force fit with the edge of the wafer or by means of a form fit with the edge of the wafer.

The free ends of the wafer contact fingers are provided with a groove for receiving the edge region of a wafer or with a chamfer for receiving the edge region of the wafer.

The wafer contact fingers may be each configured to be at least partially elastic and/or each consist at least partially of an elastic material.

The wafer contact fingers may consist at least partially of an electrostatic discharge (ESD) material.

The invention also provides the use of a wafer chuck according to the invention in a wafer process device, preferably in a scanning acoustic microscope.

Also provided is a wafer process device, preferably a scanning acoustic microscope, with a wafer chuck according to the invention.

DETAILED DESCRIPTION OF THE INVENTION

Figure 1:
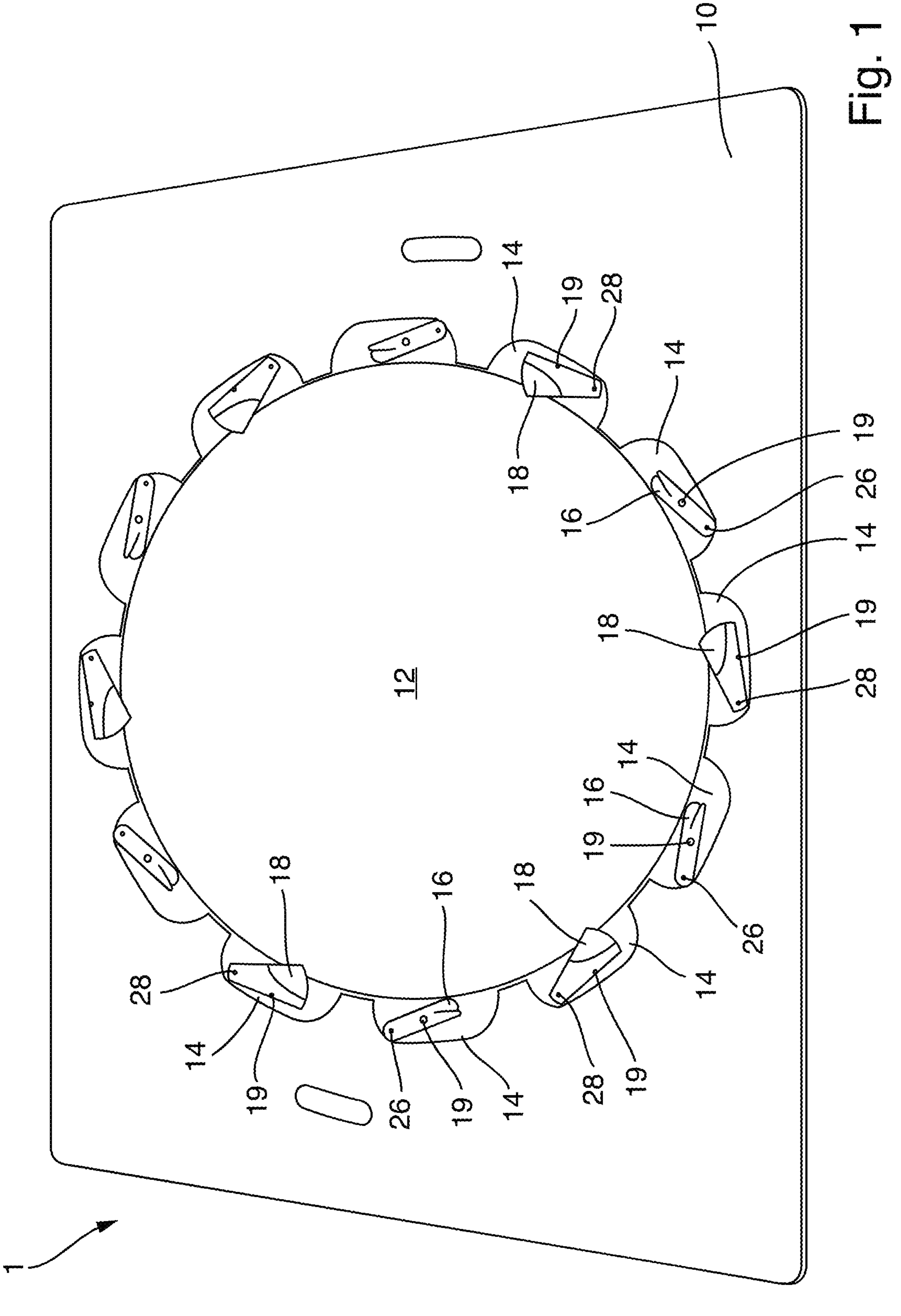
FIG. 1 schematically shows a perspective view of a base plate of a wafer chuck according to the invention for a scanning acoustic microscope.

An object of the invention is to enable a reproducible fixing of wafers in a wafer process device, for example in a scanning acoustic microscope, in a simple manner.

The object is achieved by a wafer chuck for handling a wafer, in particular in a wafer process device, further preferably in a scanning acoustic microscope, with a fixing device for the wafer, wherein the fixing device has a free space for receiving the wafer and a holder with multiple wafer contact fingers for the wafer, which are movable relative to the holder, wherein the wafer contact fingers are arranged annularly around the free space for the wafer, preferably in one plane, wherein the wafer contact fingers can be moved in the direction of the free space for the wafer or can be moved away from the free space for the wafer, wherein, preferably exclusively, one actuation device for the wafer contact fingers is provided and, when the actuation device is actuated, the wafer contact fingers are moved or can be moved simultaneously.

The invention is based on the idea that, in the case of the wafer chuck for a wafer process device, e.g., a scanning acoustic microscope, the wafers are received in a free space of the fixing device and are held and fixed here using multiple wafer contact fingers which are arranged around the free space for the wafer and are brought into contact with the edge or the edge region of the wafer. For this purpose, the movable wafer contact fingers are arranged annularly around the free space, preferably in a plane, and are moved in the direction of the wafer arranged in the free space to fix the wafer. If the wafer is removed, the contact between the wafer contact fingers and the edge of the corresponding wafer or its edge region is released, wherein in doing so the wafer contact fingers are moved away from the free space or respectively from the wafer. For the reversible and simultaneous movement of the wafer contact fingers, an actuation device is provided with which multiple wafer contact fingers can be synchronously moved simultaneously.

Because the wafer positioned in the free space is held by means of the wafer chuck and using wafer contact fingers that are movable or respectively moved synchronously, it is possible, for example, in the case of a scanning acoustic microscope, to examine or respectively ultrasonically test a wafer completely, since no more disruptive structures are present on the upper side and underside of the wafer. Here, the individual wafer contact fingers hold the wafer in a form-fitting or force-fitting manner, wherein the wafer contact fingers are brought into contact with the peripheral edge of the wafer in the holding positions. Here, a stabilization of the wafer at the edge is achieved, whereby disruptive vibrations and movements of the wafer, for example, during the examination by means of the scanning acoustic microscope, are suppressed. The resulting ultrasonic images of the scanning acoustic microscope are thus free of artifacts or image disruptions.

In the context of the invention, it is possible that the wafer chuck according to the invention is employed or respectively is used in further wafer process devices, such as defect analysis devices, coating devices, lithography devices, wafer testing devices, wafer production devices, and wafer processing devices, etc., in order to fix a wafer in the wafer process devices for the appropriate application. When the fixing of wafers is described by way of example in a scanning acoustic microscope in the following, the embodiments also apply accordingly to further wafer process devices.

In addition, the invention is distinguished in that reproducible results are achieved by using the wafer chuck since, due to the defined and synchronized movement of the wafer contact fingers during the fixing process, the wafer contact fingers are brought into contact with the edge or the edge region of the wafer. In doing so, the wafer contact fingers are moved simultaneously, meaning synchronously, in the direction of the edge region or the edge of the wafer by means of the actuation device.

Because the wafer contact fingers touch the edge of the wafer, a high repeatability of the wafer positioning is also enabled.

For this purpose, it is provided in an advantageous embodiment of the wafer chuck that the holder has multiple wafer contact fingers, each having a pivot axis, wherein the wafer contact fingers are each pivotable about their pivot axes, wherein the pivot axes of the wafer contact fingers are aligned parallel to each other, wherein the, preferably single, actuation device for the wafer contact fingers is configured such that the wafer contact fingers are pivoted or can be pivoted simultaneously about their pivot axes when the actuation device is actuated.

In an alternative embodiment, multiple wafer contact fingers can be moved linearly and reversibly, wherein the linearly guided and simultaneously moved wafer contact fingers can be brought into contact with the edge region of the wafer or can be moved away from the wafer when the actuation device is actuated.

In particular, more than three wafer contact fingers which are arranged annularly around the free space for the wafer, in particular at regular distances and/or in one plane, are arranged on the holder. By means of the actuation device, the wafer contact fingers are moved, in particular pivoted, in the direction of the wafer, or moved away, in particular pivoted away, from it when the contact with the wafer is released. Preferably, the actuation device is actuated or respectively moved by means of a drive.

In another embodiment, it is provided here that, when the actuation device is actuated, the wafer contact fingers can be brought or are brought into contact with the edge of a wafer or the contact of the individual wafer contact fingers with the wafer is released or can be released. The wafer is positioned here in the free space of the fixing device, preferably in the plane of the wafer contact fingers.

In addition, one embodiment of the wafer chuck is distinguished in that the fixing device has as a holder a holding ring with a disk-shaped receiving hole, formed as a free space, for receiving a wafer, wherein in particular the holding ring is produced from an electrically conductive material, in particular metal, further preferably steel or stainless steel. This results in a single-piece embodiment of the holder by the holding ring on which the wafer contact fingers are arranged. In this case, the disk-shaped or circular receiving hole of the holding ring forms the free space for the wafer, in which it is arranged, for example, for the scanning microscope examination or for an application in a further wafer process device.

For this purpose, it is also provided according to one embodiment of the wafer chuck that the wafer contact fingers are arranged annularly on the holding ring, wherein in particular the holding ring is configured with recesses for receiving wafer contact fingers. The wafer contact fingers are preferably arranged at regular distances around the receiving hole of the holding ring.

In particular, according to another aspect, the actuation device has for the wafer contact fingers control curves, each for one wafer contact finger, wherein the control curves are each operatively connected to the wafer contact finger. It is possible by means of the control curves to move the wafer contact fingers operatively connected thereto in the direction of the wafer or respectively away from it. Due to the pivotability, the wafer contact fingers are reversibly movable. Due to the corresponding control curves, the wafer contact fingers are moved synchronously in a guided manner by means of the actuation device. This results in an exact adjustment of the wafer to be examined.

In particular, the actuation device for the wafer contact fingers is configured as a control ring, wherein in particular the control ring can be moved relative to a or to the holder, in particular to a or the holding ring for the wafer contact fingers, and/or wherein in particular the control ring is produced from an electrically conductive material, in particular metal, further preferably steel or stainless steel.

In one embodiment, the control ring can preferably be rotated coaxially to the holding ring, wherein the control ring is furthermore also guided coaxially to the holding ring. Because the control ring is configured with corresponding control curves for the respective wafer contact fingers, it is possible that the wafer contact fingers are guided in their position, which is specified by the control curve in the control ring.

An advantageous embodiment of the wafer chuck results from the wafer chuck having at least two different types of wafer contact fingers. As a result, it is possible, for example, that the wafer is held in a form-fitting manner in the free space or respectively receiving hole for the wafer optionally by means of wafer contact fingers of a first type, or the wafer is held in a force-fitting manner by means of wafer contact fingers of a second type. With a force-fitting fixing of the wafer, the flanks of the free ends of the wafer contact fingers are configured vertically, whereby the wafer is held in its position by static friction. With a form-fitting fixing of the wafer, the free ends of the wafer contact fingers which are brought into contact with the wafer have, for example, a (holding) groove or a chamfer. In this case, the wafer is guided and fixed in a holding groove by, for example, a sliding friction. In particular, the wafer contact fingers for a form-fitting holding of the wafer are configured with ends that are complementary in shape and/or function in order to form a form fit with the edge of the wafer.

In another embodiment of the wafer chuck, it is provided that the control ring for the wafer contact fingers has one control curve for each type of wafer contact fingers, wherein the control curves for each type of wafer contact fingers differ from each other. As a result, it is possible to move each type of wafer contact fingers simultaneously due to the respective control curves.

Furthermore, an embodiment of the wafer chuck is distinguished in that, with a rotational movement of the control ring in a first direction of rotation, the control curves for the wafer contact finger are configured such that, by means of a control curve of a first type for the wafer contact fingers of a first type, the wafer contact fingers of the first type are pivoted in the direction of a wafer and, simultaneously by means of a control curve of a second type for the wafer contact fingers of a second type, the wafer contact fingers of the second type are pivoted away from the wafer, and that when the control ring is moved in a second direction of rotation which is opposite to the first direction of rotation, the control curves for the wafer contact fingers are configured such that, by means of the control curve of the first type for the wafer contact fingers of the first type, the wafer contact fingers of the first type are pivoted away from the wafer and, simultaneously by means of the control curves of the second type for the wafer contact fingers of the second type, the wafer contact fingers of the second type are pivoted in the direction of the wafer. This makes it possible to alternately bring the wafer contact fingers of the first type and the wafer contact fingers of the second type in contact with the wafer. It can be provided here that the wafer contact fingers of a first type fix the wafer in a force-fitting manner, while the wafer contact fingers of the second type fix the wafer in a form-fitting manner.

In the context of the invention, it is possible that the wafer chuck has multiple different types of wafer contact fingers. In this case, the wafer contact fingers are configured such that a wafer is held by means of a force fit with the edge of the wafer or by means of a form fit with the edge of the wafer. Furthermore, in another embodiment, the wafer contact fingers can be configured with support surfaces for a wafer. For example, a wafer chuck according to the invention has at least or exclusively three wafer contact fingers for forming a (holding) form fit with the wafer and further multiple, at least three, wafer contact fingers for forming a (holding) force fit with the wafer. In addition, a wafer chuck can have wafer contact fingers with support surfaces additionally or instead of force-fitting or form-fitting wafer contact fingers. Wafers are hereby reproducibly fixed in the free space for the wafer.

For example, wafer contact fingers with support surfaces serve to place the wafer on the support surfaces during the use of (semi)automatic loading and unloading systems before the wafer is fixed with force-fitting or form-fitting wafer contact fingers. After the fixing, the contact of the wafer contact fingers, which have support surfaces, with the respective wafer is released, for example, by a pivoting-away movement.

According to an advantageous embodiment of the wafer chuck, it is provided in another aspect that the fixing device is configured as a holding frame with a polygonal or polygon-like, in particular closed, free space, in particular a receiving hole, for receiving a wafer, wherein in particular the holding frame with the polygonal or polygon-like free space, in particular receiving hole, is produced from an electrically conductive material, in particular metal, further preferably steel or stainless steel. For example, the free space has for the wafer a rectangular or square shape in a plane. The pivotable wafer contact fingers are arranged in the peripheral region of the polygonal or polygon-like free space in order to hold the wafer arranged in the free space.

Preferably, the free space for the wafer is configured to be complimentary in shape to the design of the wafer. For this purpose, the wafer to be fixed can have, for example, a polygonal, in particular rectangular or square, shape. Preferably, the free space for the wafer is configured as a receiving hole or with a support surface for the wafer, wherein the wafer contact fingers are arranged around the free space for the wafer.

For holding a wafer, it is provided in another aspect of the wafer chuck that the wafer contact fingers are arranged adjacent to the polygonal or polygon-like free space of the holding frame.

Advantageously, an embodiment of the wafer chuck provides that the actuation device for the wafer contact fingers has an, in particular single, control body, in particular a control cable and/or control rod, for the wafer contact fingers or multiple control bodies, preferably working together, in particular control cables and/or control rods, for the wafer contact fingers, wherein the control body or the control bodies are operatively connected, in particular connected, to the wafer contact fingers, wherein in particular the control body or the control bodies for the wafer contact fingers are produced from an electrically conductive material, in particular metal, further preferably steel or stainless steel. By means of the movable control body or control bodies, it is possible that the wafer contact fingers arranged along the outer periphery of the polygonal or polygon-like free space or respectively receiving hole for a wafer are moved simultaneously, i.e., synchronously. It is preferably provided here that multiple wafer contact fingers on multiple polygon sides are pivoted or can be pivoted synchronously. The control body or control bodies can in this case be configured to be flexible or rigid.

In one embodiment of the control body, it is configured as an, in particular flexible, control cable for multiple or all wafer contact fingers, wherein the control cable is arranged on the holding frame in the edge region of the free space, in particular receiving hole, for example using redirection rollers, redirection guides, or the like, and is connected to the wafer contact fingers to be pivoted. In a different embodiment, if the control body has one, preferably rigid, control rod on each side of the polygonal free space or respectively receiving hole, it is also provided, for example, in the context of the invention that the movable control rods are connected to each other using redirection devices. Moreover, in the context of the invention the control body for the wafer contact fingers has at least one control cable and/or at least one control rod.

In addition, an embodiment of the wafer chuck is distinguished in that the control body or the control bodies for the wafer contact fingers is or are guided movably along the sides of the polygonal or polygon-like free space, in particular receiving hole, of the holding frame.

In order to move the control body or control bodies that are connected to the wafer contact fingers, it is also provided in the case of the wafer chuck that a drive for the control body or the control bodies is provided.

In addition, one embodiment of the wafer chuck is distinguished in that, when the control body is moved or when the control bodies are moved in a direction of movement, preferably along the polygonal or polygon-like free space, in particular receiving hole, of the holding frame, at least one or more first wafer contact fingers are moved in a pivoting direction and simultaneously at least one further wafer contact finger is moved or can be moved opposite to the pivoting direction of the first wafer contact finger or fingers.

According to another aspect, the wafer chuck preferably has at least two different types of wafer contact fingers which are arranged on the edge of the polygonal or polygon-like free space, in particular receiving hole, of the holding frame.

It is also provided in an embodiment of the wafer chuck that, when the control body or control bodies move in a first direction, one or more wafer contact fingers of a first type are pivoted or can be pivoted in the direction of a wafer and simultaneously one or more wafer contact fingers of the second type are pivoted away or can be pivoted away from the wafer.

In a preferred embodiment of the wafer chuck, it is also provided that the wafer contact fingers each have free ends which face the edge of the wafer, wherein the free ends of the wafer contact fingers are configured such that the wafer contact fingers hold a wafer by means of a force fit with the edge of the wafer or by means of a form fit with the edge of the wafer.

For a form-fitting fixing of the wafer by means of the wafer chuck, it is provided that the free ends of the wafer contact fingers are provided with a groove for receiving the edge region of a wafer or with a chamfer for receiving the edge region of the wafer.

Moreover, it is preferred in one embodiment that the wafer contact fingers are each configured to be at least partially elastic and/or that the wafer contact fingers each consist at least partially of an elastic material. It is thereby possible to design the wafer contact fingers such that for an adaptation of the elasticity and of the path of the wafer contact fingers a predetermined, preferably maximum, holding force per wafer contact finger can be set, wherein it is possible, for example, that the force on the edge of a wafer can be defined by a track curve or control curve for the wafer contact finger or fingers and the elasticity of the wafer contact fingers. It is also possible that they are configured as springy elements due to their elasticity. Furthermore, it is possible in the context of the invention that the wafer contact fingers are produced from a damping material or are configured with a damping material, for example, for the wafer contact face. In one embodiment, it is also provided that the wafer contact fingers are moved by a spring or a spring element or the like.

Preferably, the wafer contact fingers consist at least partially of an electrostatic discharge (ESD) material.

In addition, the object is achieved by a use of a wafer chuck in a wafer process device, preferably in a scanning acoustic microscope, wherein the wafer chuck is configured according to the aforementioned embodiments. We expressly refer to the above explanations for this in order to avoid repetitions.

Furthermore, the object is achieved by a wafer process device, preferably a scanning acoustic microscope, which is configured with a wafer chuck according to the invention, as described above. We expressly refer to the above explanations in order to avoid repetitions in this regard.

Further features of the invention will become evident from the description of embodiments according to the invention, together with the claims and the appended drawings. Embodiments according to the invention can fulfill individual features or a combination of several features.

Within the context of the invention features which are labeled with “in particular” or “preferably” are to be understood to be optional features.

The invention is described below, without restricting the general idea of the invention, based on exemplary embodiments in reference to the drawings, whereby we expressly refer to the drawings with regard to the disclosure of all details according to the invention that are not explained in greater detail in the text. In the drawings:

In the drawings, the same or similar elements and/or parts are, in each case, provided with the same reference numerals such that they are not introduced again in each case.

Figure 2:
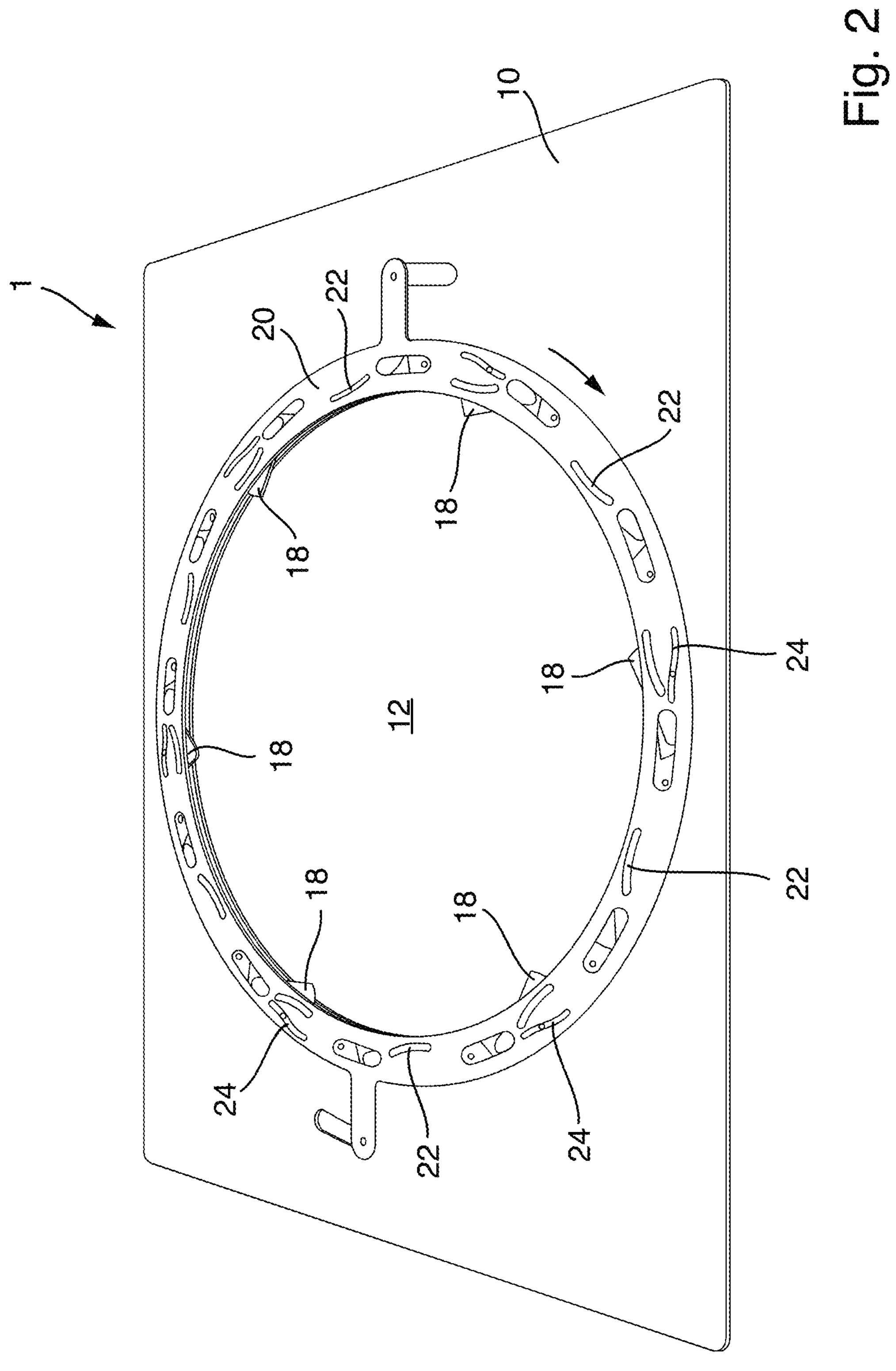
FIG. 2 schematically shows a perspective view of a wafer chuck according to the invention.
Figure 3:
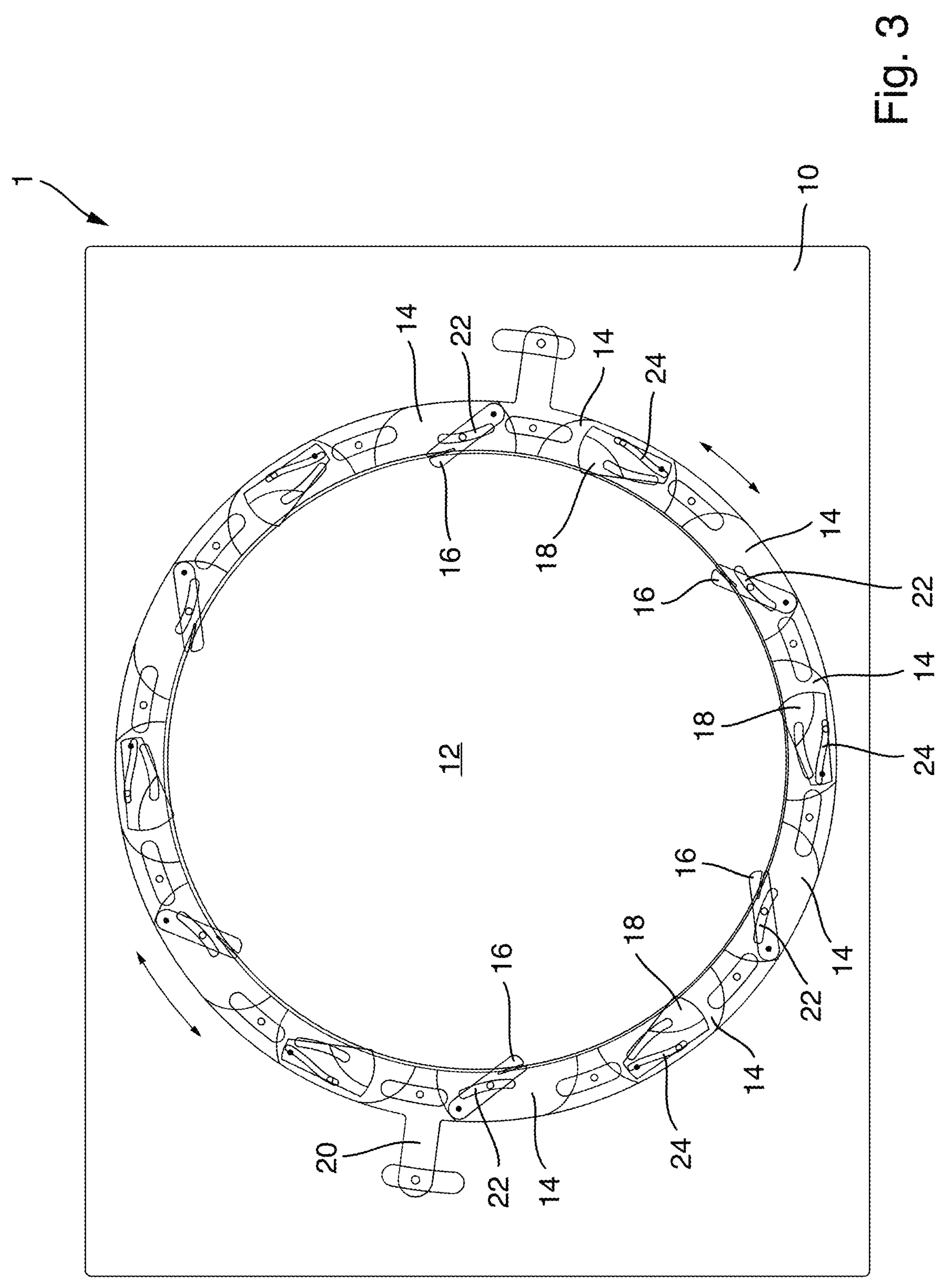
FIG. 3 schematically shows a plan view of the wafer chuck from FIG. 2.

FIG. 1 schematically shows the view of a base plate 10 which is part of a wafer chuck 1 for a scanning acoustic microscope. In FIG. 2 and FIG. 3, a perspective view and a plan view of the wafer chuck 1 are shown.

The base plate 10 has a receiving hole 12 in the middle for a wafer which is arranged in the middle of the receiving hole 12. Around the circular receiving hole 12, pockets 14 are formed adjacently in the base plate 10, in which pockets wafer contact fingers 16, 18 are arranged alternating in the peripheral direction of the receiving hole 12. The wafer contact fingers 16, 18 have corresponding pivot axes 26 or respectively 28, about which the wafer contact fingers 16, 18 are pivotably mounted. The pivot axes 26, 28 are aligned here perpendicular to the flat surface of the base plate 10.

An adjusting ring 20 is arranged above the receiving pockets 14 or respectively the wafer contact fingers 16, 18 arranged therein (cf. FIG. 2, 3). The adjusting ring 20 is configured here as an actuation device for the wafer contact fingers 16, 18. In the representation in FIG. 3, the adjusting ring 20 is drawn in a transparent representation so that the receiving pockets 14 arranged under it and the wafer contact fingers 16, 18 arranged therein are visible. As can be seen in FIG. 1, the wafer contact fingers 16, 18 each have a projection 19 on the upper side (cf. FIG. 1).

The adjusting ring 20 has control curves 22, 24 with which the projections 19 of the wafer contact fingers 16, 18 engage, whereby the adjusting ring 20 is operatively connected to the wafer contact fingers 16, 18. Twisting the adjusting ring 20 relative to the base plate 10 pivots the wafer contact fingers 16, 18 due to the control curves 22, 24. In the representation shown in FIG. 2, the free ends of the wafer contact fingers 18 are rotated out of their pockets 14, while the wafer contact fingers 16 are arranged in the respective pockets 14. Depending on the direction of rotation of the adjusting ring 20, the wafer contact fingers 16 or the wafer contact fingers 18 are alternately brought into contact with a wafer arranged in the receiving hole 12.

In the exemplary embodiments shown in FIG. 1 to FIG. 3, the wafer contact fingers 16 are configured for fixing a wafer in a force-fitting manner, wherein the wafer contact fingers 16 are configured here in particular to be elastic so that the free ends of the wafer contact fingers 16 lie on the outer edge of the wafer. The wafer contact fingers 18 differ from the wafer contact fingers 16, wherein the wafer contact fingers 18 are configured in particular to receive in a form-fitting manner. For example, the wafer contact fingers 18 have in this case corresponding grooves or recesses or the like so that the edge region of the wafer is brought into contact with the groove or the recesses of the wafer contact fingers 18.

The wafer chuck 1 is, for example, part of a sample holder and can be adjusted parallel to the scanning plane of the scanning microscope for an examination by means of a scanning acoustic microscope. For example, the sample holder has corresponding adjusting means for this.

Figure 4:
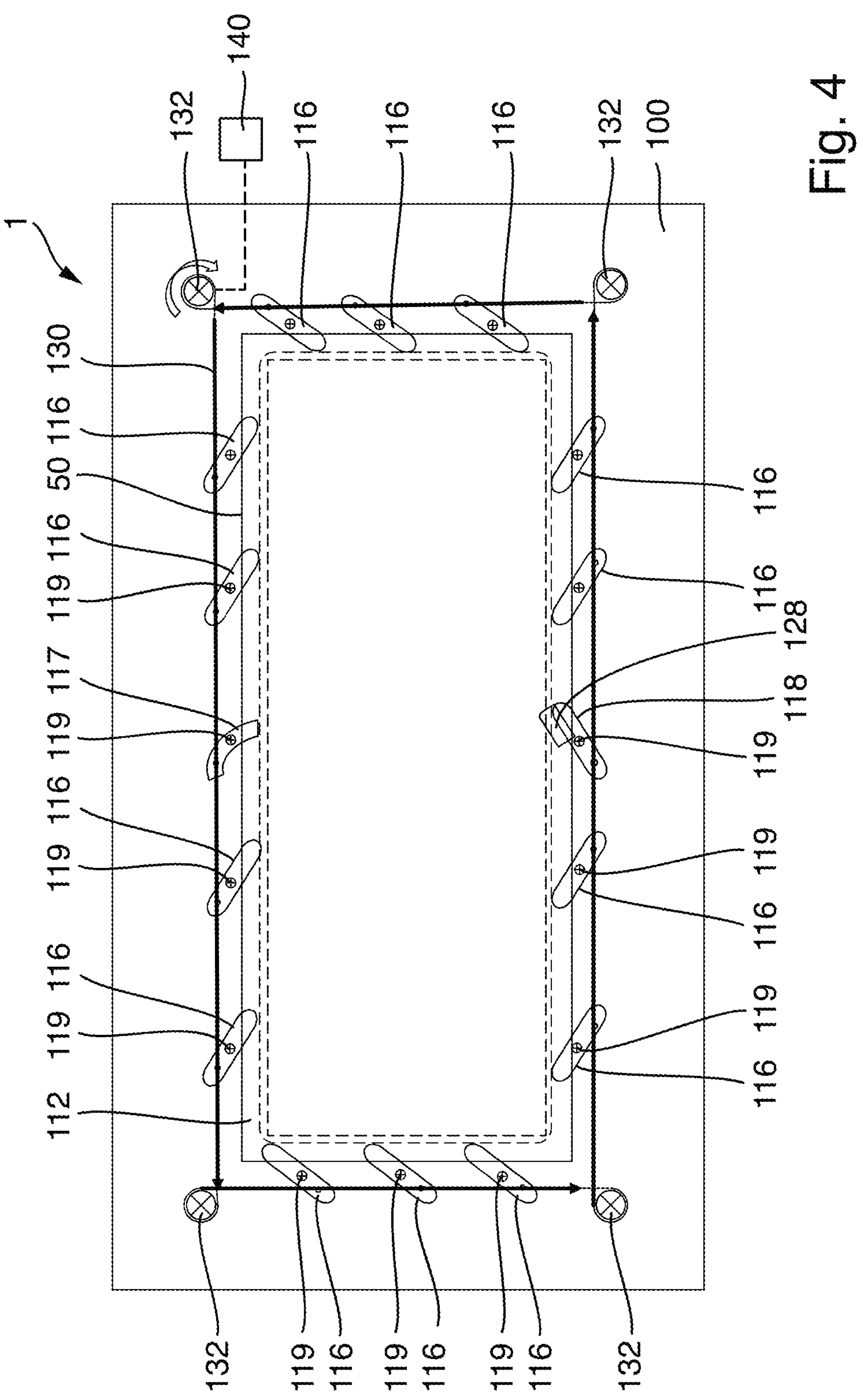
FIG. 4 schematically shows a plan view of a wafer chuck according to another embodiment.

FIG. 4 shows a plan view of a wafer chuck 1 according to another embodiment. Here, the wafer chuck 1 has a base body 100 with a rectangular shape. The base body 100 is configured as a frame-shaped holder and, has in the interior as a free space for a wafer 50 a rectangular receiving hole 112 for a rectangular wafer 50 indicated by a dashed line.

The receiving hole 112 is rectangular, i.e., polygonal, and thus is configured to be complementary in shape to the rectangular shape of the wafer 50. In the context of the invention, it is possible that the receiving hole 112 and the wafer 50 have a different polygonal structure.

Along each side of the rectangular receiving hole 112, pivotable wafer contact fingers 116, 117, 118 for the wafer 50 are arranged on the base body 100. The wafer contact fingers 116 are configured here as straight, elongated bodies. The wafer contact finger 117 is configured as a bent or bow-shaped body. The wafer finger 118 arranged opposite the wafer finger 117 is configured as a support finger, wherein the wafer contact finger 118 has a corresponding support surface 128 for the wafer 50.

The wafer contact fingers 116, 117, 118 are pivotably mounted and each have a pivot axis 119. In order to synchronously pivot the wafer contact fingers 116, 117, 118 about their pivot axes 119, the wafer contact fingers 116, 117, 118 are connected to a closed pulling cable 130.

The pulling cable 130 is guided here along the sides of the rectangular receiving hole 112, wherein redirection rollers 132 are arranged in the corners of the rectangular receiving hole 112, wherein the pulling cable 130 is guided here with a transition angle of about 270° around the redirection rollers 132. A drive 140 is provided for one of the redirection rollers 132, while the other redirection rollers 132 are configured as rollers that rotate along with it. The pulling cable 130 here is connected to each of the wafer contact fingers 116, 117, 118 so that, when the pulling cable 130 is moved by means of the redirection roller 132 driven by the drive 140, the wafer contact fingers 116, 117, 118 are pivoted simultaneously.

The wafer contact finger 118 with the support surface 128 is mounted in the opposite direction as the other wafer contact fingers 116, 117 so that the pivoting movement or respectively pivoting direction of the wafer contact finger 118 is opposite to the pivoting direction of the wafer contact fingers 116, 117.

When the wafer 50 is arranged in the receiving hole 112, the wafer contact fingers 116, 117 are pivoted away, while the wafer contact finger 118 with the support surface 128 is pivoted in so that the wafer 50 is brought into contact with the support surface 128 of the wafer contact finger 118 or respectively lies on it. In the context of the invention, multiple wafer contact fingers 118 with respective support surfaces 128 for the wafer 50 can also be arranged on the receiving hole 112. After that, the wafer contact fingers 116, 117 are pivoted in the direction of the wafer 50, while the wafer contact finger 118 is pivoted away from the wafer 50.

Figure 5:
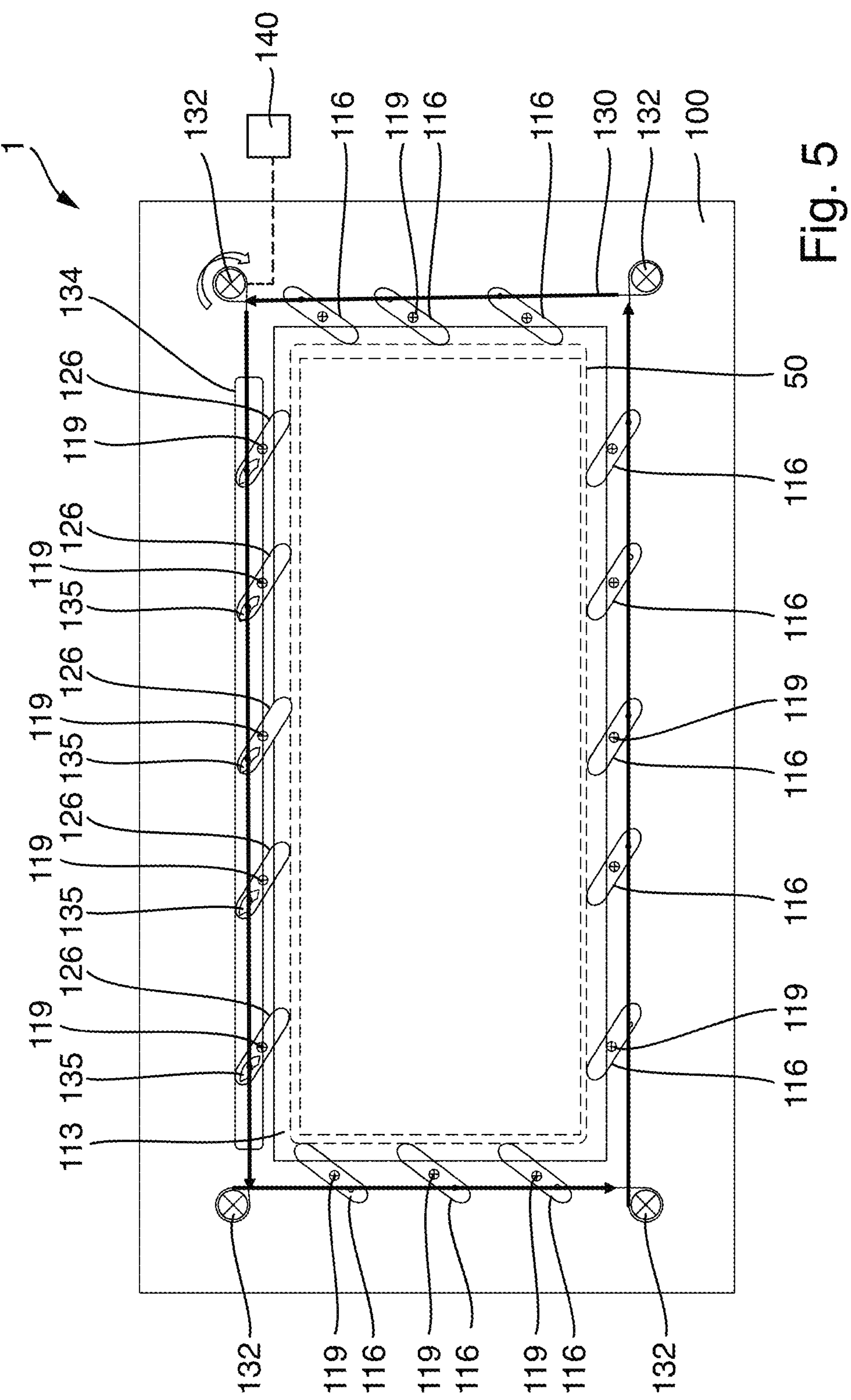
FIG. 5 schematically shows a plan view of a wafer chuck according to another embodiment.

FIG. 5 shows another exemplary embodiment of the wafer chuck 1 with the rectangular base body 100, wherein the base body 100 has a support surface 113 as a free space for the wafer 50, on which the wafer 50 is arranged. Pivotable wafer contact fingers 116, 126 are arranged along the rectangular support surface 113. The wafer contact fingers 116, 126 are each pivotably mounted about their own corresponding pivot axes 119.

In order to execute a pivoting movement of the wafer contact fingers 116 in which they pivot synchronously, the wafer contact fingers 116 are connected to the pulling cable 130 which is guided around the redirection roller 132. Furthermore, the pulling cable 130 is connected to an, in particular rigid, guide rod 134 for the wafer contact fingers 126 which are arranged on a (longitudinal) side of the support surface 113, wherein the guide rod 134 has corresponding control curves 135 for the wafer contact fingers 126 connected thereto. The guide rod 134 here is configured to be rigid and is connected to the pulling cable 130 so that, when the pulling cable 130 is moved, the guide rod 134 is moved linearly, whereby the wafer contact fingers 126 execute a synchronous pivoting movement, by means of the control curves 135 in the guide rod 134, together with the wafer contact fingers 116 which are directly connected to the pulling cable 130.

All of the indicated features, including those which are to be inferred from the drawings alone, as well as individual features which are disclosed in combination with other features, are deemed to be essential to the invention both alone and in combination. Embodiments according to the invention can be fulfilled by individual features or a combination of several features.

LIST OF REFERENCE SIGNS

1 Wafer chuck
10 Base plate
12 Receiving hole
14 Pocket
16 Wafer contact finger
18 Wafer contact finger
19 Projection
20 Adjusting ring
22 Control curve
24 Control curve
26 Pivot axis
29 Pivot axis
50 Wafer
100 Base body
112 Receiving hole
113 Support surface
116, 117, 118 Wafer contact fingers
119 Pivot axis
126 Wafer contact finger
128 Support surface
130 Pulling cable
132 Redirection roller
134 Guide rod
135 Control curve
140 Drive

The invention claimed is:

1. A wafer chuck for handling a wafer in a wafer process device, the wafer chuck comprising:

a fixing device for holding the wafer, wherein the fixing device comprises:

a free space for receiving the wafer; and a holder with multiple wafer contact fingers for the wafer, the multiple wafer contact fingers are each movable relative to the holder, and an actuation device for actuating the multiple wafer contact fingers;

wherein the multiple wafer contact fingers are arranged annularly in one plane around the free space for the wafer, the multiple wafer contact fingers are each pivotably mounted on the holder about a pivot axis so as to be movable in the direction of the free space to hold the wafer and away from the free space to release the wafer, the multiple wafer contacts fingers are each elongated about the pivot axis; and when the actuation device is actuated, the wafer contact fingers are moved simultaneously.

2. The wafer chuck according to claim 1, wherein the pivot axes of the multiple wafer contact fingers are aligned parallel to each other, the actuation device for the multiple wafer contact fingers is configured such that, when the actuation device is actuated, the multiple wafer contact fingers are each pivoted about their pivot axes simultaneously.

3. The wafer chuck according to claim 1, wherein when the actuation device is actuated, the multiple wafer contact fingers are brought into contact with the an edge of the wafer or the contact of individual wafer contact fingers with the wafer is released.

4. The wafer chuck according to claim 1, wherein the holder having a holding ring with a disk-shaped receiving hole formed as the free space for receiving the wafer, wherein the holding ring is produced from an electrically conductive material.

5. The wafer chuck according to claim 4, wherein the multiple wafer contact fingers are arranged annularly on the holding ring, wherein the holding ring is configured with recesses for receiving wafer contact fingers.

6. The wafer chuck according to claim 1, wherein the actuation device for the multiple wafer contact fingers has control curves, each for one individual wafer contact finger, wherein the control curves are each operatively connected to the multiple wafer contact fingers.

7. The wafer chuck according to claim 6, wherein the actuation device for the multiple wafer contact fingers is configured as a control ring, wherein one or more of the control ring can be moved relative to the holder, to the holding ring for the multiple wafer contact fingers, and the control ring is produced from an electrically conductive material.

8. The wafer chuck according to claim 1, wherein the wafer chuck has at least two different types of wafer contact fingers.

9. The wafer chuck according to claim 8, wherein the control ring for the multiple wafer contact fingers has one control curve for each type of the multiple wafer contact fingers, wherein the control curves for each type of the multiple wafer contact fingers differ from each other.

10. The wafer chuck according to claim 9, wherein with a rotational movement of the control ring in a first direction of rotation, the control curves for the multiple wafer contact fingers are configured such that, by a first control curve for the multiple wafer contact fingers of a first type, the multiple wafer contact fingers of the first type are pivoted in the direction of the wafer and, simultaneously by a second control curve for the multiple wafer contact fingers of a second type, the multiple wafer contact fingers of the second type are pivoted away from the wafer, and that when the control ring is moved in a second direction of rotation which is opposite to the first direction of rotation, the first and second control curves for the wafer contact fingers are configured such that, by the first control curve for the multiple wafer contact fingers of the first type, the multiple wafer contact fingers of the first type are pivoted away from the wafer and, by means of the second control curve for the multiple wafer contact fingers of the second type, the multiple wafer contact fingers of the second type are pivoted in the direction of the wafer.

11. The wafer chuck according to claim 1, wherein the holder is configured as a holding frame and the free space has a polygonal free space for receiving the wafer, wherein the holding frame is produced from an electrically conductive material.

12. The wafer chuck according to claim 11, wherein the wafer chuck has at least two different types of the multiple wafer contact fingers.

13. The wafer chuck according to claim 12, wherein when the control body or control bodies are moved in a first direction, one or more wafer contact fingers of a first type are pivoted in the direction of a wafer and simultaneously one or more wafer contact fingers of the second type are pivoted away from the wafer.

14. The wafer chuck according to claim 11, wherein the multiple wafer contact fingers are arranged adjoining the polygonal free space of the holding frame.

15. The wafer chuck according to claim 1, wherein the actuation device for the multiple wafer contact fingers has one of a single, control body, a control cable and a control rod for the multiple wafer contact fingers or multiple control bodies, working together, wherein the control body or the multiple control bodies are operatively connected to the multiple wafer contact fingers, wherein the control body or the multiple control bodies for the multiple wafer contact fingers are produced from an electrically conductive material.

16. The wafer chuck according to claim 15, wherein the control body or the control bodies for the multiple wafer contact fingers are guided movably along the sides of the polygonal free space of the holding frame.

17. The wafer chuck according to claim 15, further comprising a drive for the control body or the control bodies.

18. The wafer chuck according to claim 15, wherein when the control body is moved or when the control bodies are moved in a direction of movement, along the polygonal free space of the holding frame, at least one or more first wafer contact fingers are moved in a pivoting direction and simultaneously at least one further wafer contact finger are moved opposite to the pivoting direction of the first wafer contact finger or fingers.

19. The wafer chuck according to claim 1, wherein the multiple wafer contact fingers each have free ends which face an edge of the wafer, wherein the free ends of the multiple wafer contact fingers are configured such that the multiple wafer contact fingers-hold the wafer by one of a force fit with the edge of the wafer or by a form fit with the edge of the wafer.

20. The wafer chuck according to claim 19, wherein the free ends of the multiple wafer contact fingers are each provided with one of a groove for receiving the edge region of a wafer or with a chamber for receiving the edge region of the wafer.

21. The wafer chuck according to claim 1, wherein one or more of the multiple wafer contact fingers are each configured to be at least partially elastic and that the multiple wafer contact fingers each comprise at least partially of an elastic material.

22. The wafer chuck according to claim 1, wherein the multiple wafer contact fingers at least partially comprise an electrostatic discharge (ESD) material.

23. A method of fixing a wafer in a wafer process device, the method comprising:

placing the wafer in free space in a fixing device comprising a holder with multiple elongated wafer contact fingers, the multiple wafer contact fingers are each pivotable relative to the holder about a pivot axis, the multiple wafer contact fingers are arranged annularly in one plane around the free space for the wafer; and simultaneously actuating the multiple wafer contact fingers so as to be movable in the direction of the free space to hold the wafer and away from the free space to release the wafer.

* * * * *